United States Patent
Lee

(10) Patent No.: US 10,727,884 B2
(45) Date of Patent: Jul. 28, 2020

(54) RECEPTION CIRCUIT, SEMICONDUCTOR APPARATUS AND SEMICONDUCTOR SYSTEM INCLUDING THE RECEPTION CIRCUIT

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/433,974

(22) Filed: Jun. 6, 2019

(65) Prior Publication Data
US 2020/0145036 A1  May 7, 2020

(30) Foreign Application Priority Data

Nov. 5, 2018  (KR) ........................ 10-2018-0134534

(51) Int. Cl.
*H04B 1/10* (2006.01)
*G11C 7/10* (2006.01)

(52) U.S. Cl.
CPC ......... *H04B 1/1018* (2013.01); *G11C 7/1084* (2013.01)

(58) Field of Classification Search
CPC ........................... H04B 1/1018; G11C 7/1084
See application file for complete search history.

(56) References Cited

U.S. PATENT DOCUMENTS

2003/0174023 A1* 9/2003 Miyasita ............. H03F 3/45085
330/254

FOREIGN PATENT DOCUMENTS

KR  1020170013040 A  2/2017

* cited by examiner

*Primary Examiner* — Nguyen T Vo
(74) *Attorney, Agent, or Firm* — William Park & Associates Ltd.

(57) ABSTRACT

A reception circuit includes a receiver, a noise boosting circuit and a buffer. The receiver generates a positive amplification signal and a negative amplification signal by amplifying a first input signal and a second input signal. The noise boosting circuit adjusts voltage levels of the positive amplification signal and the negative amplification signal based on the first input signal and the second input signal. The buffer generates an output signal by amplifying the positive amplification signal and the negative amplification signal.

14 Claims, 9 Drawing Sheets

RECEPTION CIRCUIT, SEMICONDUCTOR APPARATUS AND SEMICONDUCTOR SYSTEM INCLUDING THE RECEPTION CIRCUIT

CROSS-REFERENCES TO RELATED APPLICATION

The present application claims priority under 35 U.S.C. § 119(a) to Korean application number 10-2018-0134534, filed on Nov. 5, 2018, in the Korean Intellectual Property Office, which is incorporated herein by reference in its entirety as set forth in full.

BACKGROUND

1. Technical Field

Various embodiments of the present disclosure generally relate to an integrated circuit technology and, more particularly, to a semiconductor memory apparatus and semiconductor system including a reception circuit.

2. Related Art

An electronic device includes a lot of electronic elements, and a computer system includes lots of electronic components each comprising a semiconductor. Semiconductor apparatuses configuring a computer system may communicate with each other by transmitting and receiving a clock signal and data. As an operation speed of a computer system increases, an operation speed of a semiconductor apparatus also increases. For example, a frequency of a clock signal becomes greater for semiconductor apparatuses to perform a high-speed data communication with each other.

A semiconductor apparatus may transmit data to an external apparatus in synchronization with a clock signal or may receive data from an external apparatus in synchronization with the clock signal. As a frequency of the clock signal becomes greater, a margin of time for transmission or reception of data. Also, an "eye" or valid window of transmitted or received data in proportion to the reduction of the time margin. The semiconductor apparatus is coupled to the external apparatus through a signal transmission line. When a signal is transferred through the signal transmission line, signal integrity may be reduced due to reflection of the signal occurring at the signal transmission line. Therefore, a decision feedback equalizer may be used in general to compensate for a post cursor element caused by the reflection of the signal for increase of the "eye" or the valid window of the signal.

SUMMARY

In an embodiment of the present disclosure, a reception circuit may include a receiver, a noise boosting circuit, and a buffer. The receiver may be configured to amplify a first input signal and a second input signal to generate a positive amplification signal and a negative amplification signal. The noise boosting circuit may be configured to generate a positive equalization signal and a negative equalization signal based on the first input signal and the second input signal, and to adjust voltage levels of the positive amplification signal and the negative amplification signal based on the positive equalization signal and the negative equalization signal. The buffer may be configured to amplify the positive amplification signal and the negative amplification signal to generate an output signal.

In an embodiment of the present disclosure, a reception circuit may include a receiver, a noise boosting circuit, and a buffer. The receiver may be configured to output a positive amplification signal to a first amplification node and output a negative amplification signal to a second amplification node, based on a first input signal and a second input signal. The noise boosting circuit may be configured to generate a first noise boosting signal of which a voltage level varies complementarily to the positive amplification signal, and a second noise boosting signal of which a voltage level varies complementarily to the negative amplification signal, based on the first input signal and the second input signal, and to output the first noise boosting signal and the second noise boosting signal respectively to the first amplification node and the second amplification node. The buffer may be configured to generate an output signal based on voltage levels of the first amplification node and the second amplification node.

In an embodiment of the present disclosure, a reception circuit may include a receiver, a noise boosting circuit, and a buffer. The receiver may be configured to generate a positive amplification signal and a negative amplification signal by amplifying a first input signal and a second input signal. The noise boosting circuit may be configured to generate a positive equalization signal and a negative equalization signal based on the first input signal and the second input signal, and to change a voltage level of the positive amplification signal based on one of the positive equalization signal and the negative equalization signal and to change a voltage level of the negative amplification signal based on the other of the positive equalization signal and the negative equalization signal, based on a characteristic of a channel through which the first input signal is transmitted. The buffer may be configured to generate an output signal by amplifying the positive amplification signal and the negative amplification signal.

DETAILED DESCRIPTION

The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component.

Hereinafter, a semiconductor apparatus according to the present disclosure will be described below with reference to the accompanying drawings through embodiments.

Figure 1:
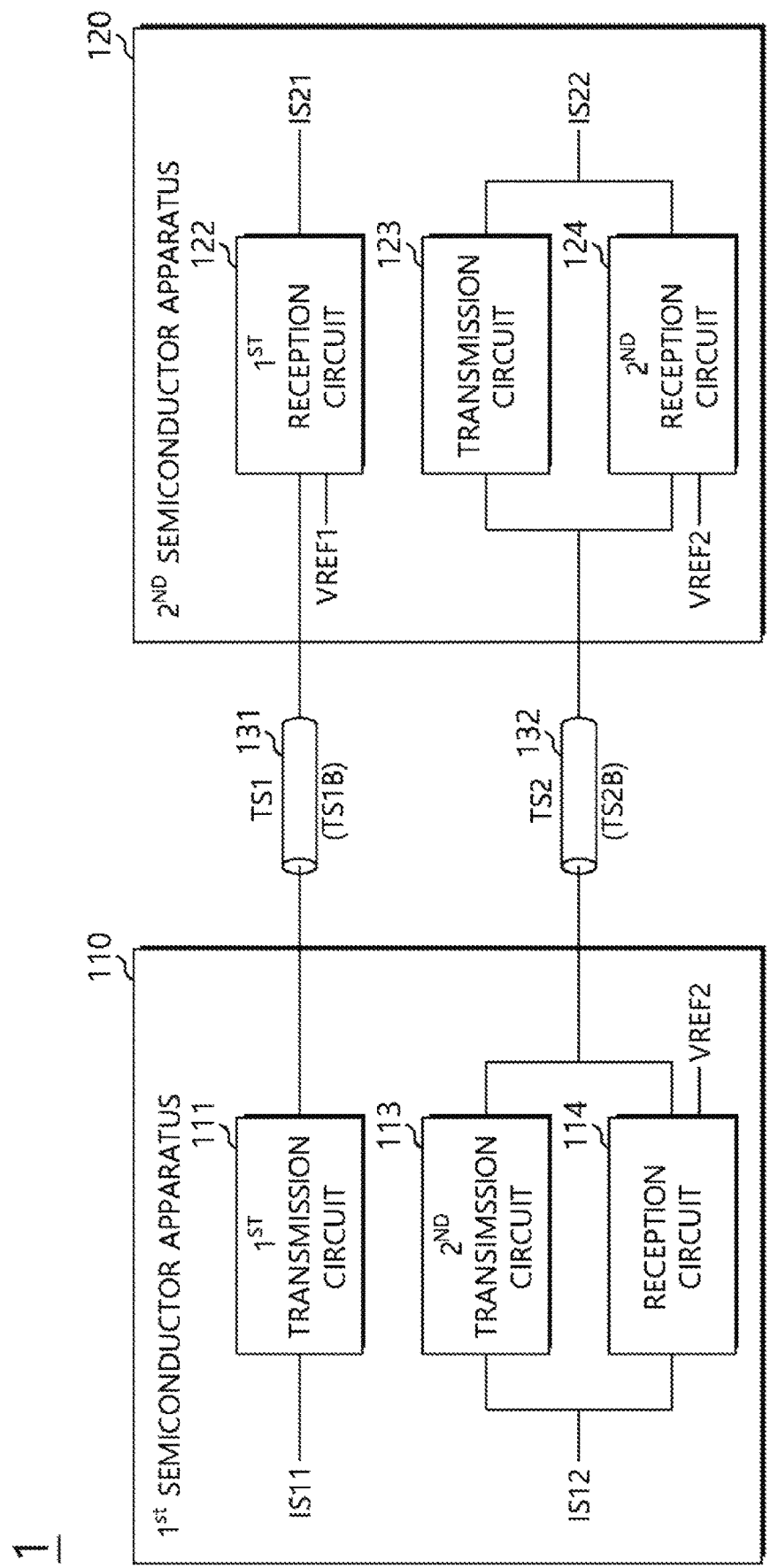
FIG. 1 is a diagram illustrating a configuration of a semiconductor system in accordance with an embodiment of the present disclosure.

FIG. 1 is a diagram illustrating a configuration of a semiconductor system 1 in accordance with an embodiment of the present disclosure. Referring to FIG. 1, the semiconductor system 1 may include a first semiconductor apparatus 110 and a second semiconductor apparatus 120. The second semiconductor apparatus 120 may provide various control signals for the second semiconductor apparatus 120 to perform operations. The first semiconductor apparatus 110 may include host apparatuses of various types. For example, the first semiconductor apparatus 110 may be one or more among a central processing unit (CPU), a graphic processing unit (GPU), a multi-media processor (MMP), a digital signal processor, an application processor (AP) and a memory controller. For example, the second semiconductor apparatus 120 may be a memory apparatus and the memory apparatus may include a volatile memory and a non-volatile memory. The volatile memory may include a static random access memory (static RAM: SRAM) and a dynamic RAM (DRAM), a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 120 may be coupled to the first semiconductor apparatus 110 through a plurality of buses 131 and 132. Each of the plurality of buses 131 and 132 may be a signal transmission path, a link or a channel for transferring various signals. The plurality of buses may include a first bus 131 and a second bus 132. The first bus 131 may be a one-way bus and may transfer a first transmission signal TS1 from the first semiconductor apparatus 110 to the second semiconductor apparatus 120. The second bus 132 may be a two-way bus and may transfer a second transmission signal TS2 from the first semiconductor apparatus 110 to the second semiconductor apparatus 120 or from the second semiconductor apparatus 120 to the first semiconductor apparatus 110. For example, the first bus 131 may be a clock bus or a command address bus. For example, the second bus 132 may be a data bus.

The first semiconductor apparatus 110 may include a first transmission circuit 111, a second transmission circuit 113 and a reception circuit 114. The first transmission circuit 111 may be coupled to the first bus 131. The first transmission circuit 111 may generate the first transmission signal TS1 based on a first internal signal IS11 within the first semiconductor apparatus 110. The first transmission circuit 111 may transmit the first transmission signal TS1 to the second semiconductor apparatus 120 through the first bus 131. The second transmission circuit 113 may be coupled to the second bus 132. The second transmission circuit 113 may generate the second transmission signal TS2 based on a second internal signal IS12 within the first semiconductor apparatus 110. The second transmission circuit 113 may transmit the second transmission signal TS2 to the second semiconductor apparatus 120 through the second bus 132. The reception circuit 114 may be coupled to the second bus 132. The reception circuit 114 may receive the second transmission signal TS2 transmitted from the second semiconductor apparatus 120 through the second bus 132. The reception circuit 114 may generate the second internal signal IS12 of the first semiconductor apparatus 110 based on the second transmission signal TS2.

The second semiconductor apparatus 120 may include a first reception circuit 122, a transmission circuit 123 and a second reception circuit 124. The first reception circuit 122 may be coupled to the first bus 131. The first reception circuit 122 may receive the first transmission signal TS1 transmitted from the first semiconductor apparatus 110 through the first bus 131. The first reception circuit 122 may generate a first internal signal IS21 of the second semiconductor apparatus 120 based on the first transmission signal TS1. The transmission circuit 123 be coupled to the second bus 132. The transmission circuit 123 may generate the second transmission signal TS2 based on a second internal signal IS22 within the second semiconductor apparatus 120. The transmission circuit 123 may transmit the second transmission signal TS2 to the first semiconductor apparatus 110 through the second bus 132. The second reception circuit 124 may be coupled to the second bus 132. The second reception circuit 124 may receive the second transmission signal TS2 transmitted from the first semiconductor apparatus 110 through the second bus 132. The second reception circuit 124 may generate the second internal signal IS22 of the second semiconductor apparatus 120 based on the second transmission signal TS2.

The first transmission signal TS1 may be a single ended signal or a differential signal provided together with a complementary signal TS1B. When the first transmission signal TS1 is a single ended signal, the first reception circuit 122 may use a first reference voltage VREF1 to generate the first internal signal IS21 of the second semiconductor apparatus 120 from the first transmission signal TS1. The first reception circuit 122 may generate the first internal signal IS21 of the second semiconductor apparatus 120 by differentially amplifying the first transmission signal TS1 and the first reference voltage VREF1. The first reference voltage VREF1 may have a level corresponding to a middle of a swing range of the first transmission signal TS1.

The second transmission signal TS2 may be a single ended signal or a differential signal provided together with a complementary signal TS2B. When the second transmission signal TS2 is a single ended signal, the reception circuit 114 of the first semiconductor apparatus 110 may use a second reference voltage VREF2 to generate the second internal signal IS12 of the first semiconductor apparatus 110 from the second transmission signal TS2. The reception circuit 114 may generate the second internal signal IS12 of the first semiconductor apparatus 110 by differentially amplifying the second transmission signal TS2 and the second reference voltage VREF2. The second reference voltage VREF2 may have a level corresponding to a middle of a swing range of the second transmission signal TS2. The second reception circuit 124 of the second semiconductor apparatus 120 may use the second reference voltage VREF2 to generate the second internal signal IS22 of the second semiconductor apparatus 120 from the second transmission signal TS2. The second reception circuit 124 may generate the second internal signal IS22 of the second semiconductor apparatus 120 by differentially amplifying the second transmission signal TS2 and the second reference voltage VREF2.

Figure 2:
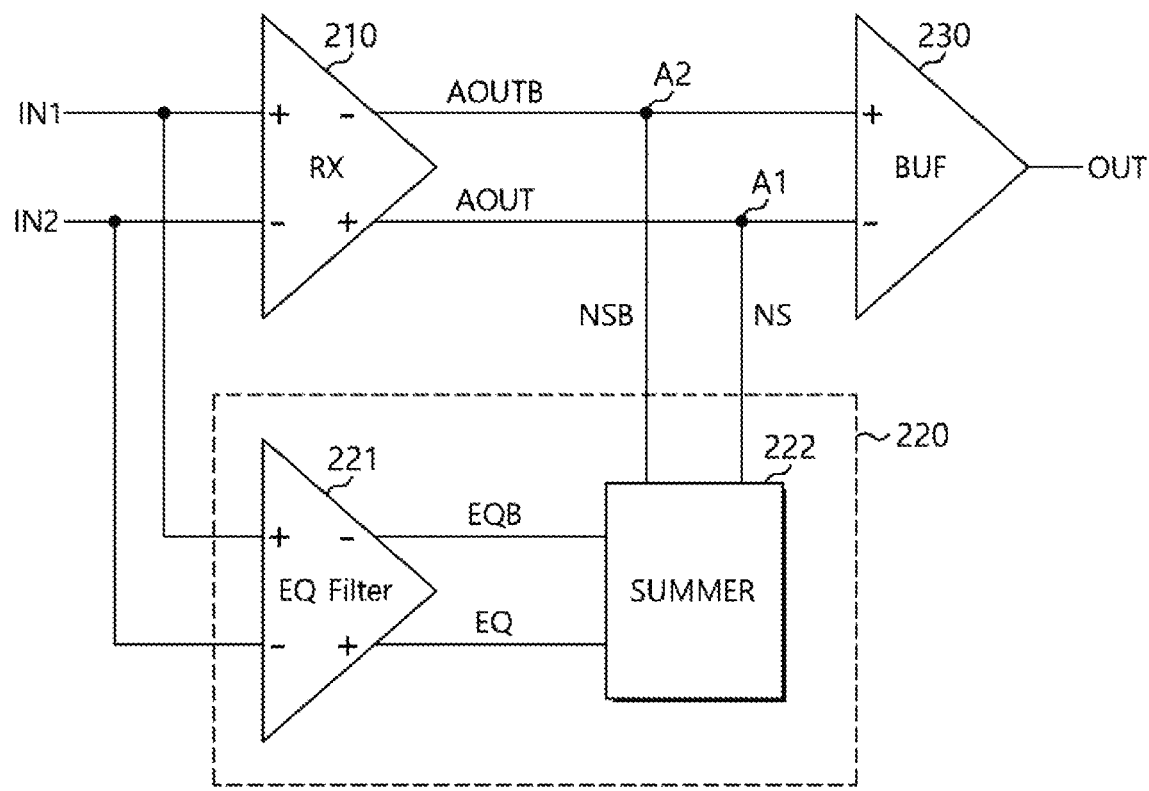
FIG. 2 is a diagram illustrating a configuration of a reception circuit in accordance with an embodiment of the present disclosure.

FIG. 2 is a diagram illustrating a configuration of a reception circuit 200 in accordance with an embodiment of the present disclosure. The reception circuit 200 may be implemented as at least one among the reception circuit 114, the first reception circuit 122 and the second reception circuit 124. Referring to FIG. 2, the reception circuit 200 may generate an output signal OUT by receiving a first input signal IN1 and a second input signal IN2. The first input signal IN1 may be a single ended signal and the second input signal IN2 may be a reference voltage. The reference voltage may have a level corresponding to a middle of a swing range of the first input signal IN1. When the reception circuit 200 is implemented as the first reception circuit 122, the first input signal IN1 may be the first transmission signal TS1 and the second input signal IN2 may be the first reference voltage VREF1. In an embodiment, the first input signal IN1 and the second input signal IN2 may be differential signals having complementary levels to each other. In an embodiment, the first input signal IN1 may be the second transmission signal TS2 and the second input signal IN2 may be the second reference voltage VREF2.

Referring to FIG. 2, the reception circuit 200 may include a receiver ("RX") 210, a noise boosting circuit 220 and a buffer ("BUF") 230. The receiver 210 may receive the first input signal IN1 and the second input signal IN2 and may generate a positive amplification signal AOUT and a negative amplification signal AOUTB based on the first input signal IN1 and the second input signal IN2. The receiver 210 may generate the positive amplification signal AOUT and the negative amplification signal AOUTB by differentially amplifying the first input signal IN1 and the second input signal IN2. The receiver 210 may output the positive amplification signal AOUT through a first amplification node A1 and may output the negative amplification signal AOUTB through a second amplification node A2. For example, the positive amplification signal AOUT may have a voltage level varying based on the first input signal IN1 and the negative amplification signal AOUTB may have a voltage level complementary to the positive amplification signal AOUT. A differential amplification circuit of any known type may be implemented as the receiver 210.

The noise boosting circuit 220 may receive the first input signal IN1 and the second input signal IN2. The noise boosting circuit 220 may change amplitudes of the positive amplification signal AOUT and the negative amplification signal AOUTB based on the first input signal IN1 and the second input signal IN2. The noise boosting circuit 220 may change voltage levels of the positive amplification signal AOUT and the negative amplification signal AOUTB based on the first input signal IN1 and the second input signal IN2. For example, the noise boosting circuit 220 may reduce the amplitudes of the positive amplification signal AOUT and the negative amplification signal AOUTB by changing the voltage levels of the positive amplification signal AOUT and the negative amplification signal AOUTB. The noise boosting circuit 220 may change the amplitude of the negative amplification signal AOUTB by changing the voltage level of the negative amplification signal AOUTB based on level change of the first input signal IN1. The noise boosting circuit 220 may change the amplitude of the positive amplification signal AOUT by changing the voltage level of the positive amplification signal AOUT based on complementary level change to the first input signal IN1. The noise boosting circuit 220 may compensate for the noise occurring within the first input signal IN1 by reducing the amplitudes of the positive amplification signal AOUT and the negative amplification signal AOUTB. The noise boosting circuit 220 may generate the output signal OUT having a level corresponding to the first input signal IN1 even when there occurs an offset of the second input signal IN2. When the second input signal IN2 is the reference voltage, the noise boosting circuit 220 may allow the reception circuit 200 to generate the output signal OUT corresponding to the first input signal IN1 even if the level of the reference voltage changes due to the offset.

The noise boosting circuit 220 may generate a first noise boosting signal NS and a second noise boosting signal NSB by receiving the first input signal IN1 and the second input signal IN2. A voltage level of the first noise boosting signal NS may change complementarily to the positive amplification signal AOUT. A voltage level of the second noise boosting signal NSB may change complementarily to the negative amplification signal AOUTB. The noise boosting circuit 220 may generate a positive equalization signal EQ and a negative equalization signal EQB based on the first input signal IN1 and the second input signal IN2. The noise boosting circuit 220 may generate the positive equalization signal EQ and the negative equalization signal EQB by differentially amplifying the first input signal IN1 and the second input signal IN2. The voltage level change of the positive equalization signal EQ may correspond to the voltage level change of the positive amplification signal AOUT. The voltage level change of the negative equalization signal EQB may correspond to the voltage level change of the negative amplification signal AOUTB. However, the positive equalization signal EQ and the negative equalization signal EQB may have reduced DC gain and increased AC gain when compared with the positive amplification signal AOUT and the negative amplification signal AOUTB. The noise boosting circuit 220 may generate the first noise boosting signal NS based on the positive equalization signal EQ and may generate the second noise boosting signal NSB based on the negative equalization signal EQB. Because the first noise boosting signal NS and the second noise boosting signal NSB are generated on the basis of the positive equalization signal EQ and the negative equalization signal EQB having the reduced DC gain and the increased AC gain when compared with the positive amplification signal AOUT and the negative amplification signal AOUTB, the first noise boosting signal NS and the second noise boosting signal NSB may have characteristics of less amplitudes and greater gradients of level changes than the positive amplification signal AOUT and the negative amplification signal AOUTB. Therefore, the noise boosting circuit 220 may compensate for the voltage level changes of the positive amplification signal AOUT and the negative amplification signal AOUTB based on a noise of the first input signal IN1 and an offset of the second input signal IN2 without changing logical levels of the positive amplification signal AOUT and the negative amplification signal AOUTB.

The noise boosting circuit 220 may output the first noise boosting signal NS through the first amplification node A1 and may output the second noise boosting signal NSB through the second amplification node A2. The first noise boosting signal NS may be mixed with the positive amplification signal AOUT at the first amplification node A1. The second noise boosting signal NSB may be mixed with the negative amplification signal AOUTB at the second amplification node A2.

The buffer 230 may generate the output signal OUT by receiving the positive amplification signal AOUT and the negative amplification signal AOUTB. The buffer 230 may generate the output signal OUT having a voltage level corresponding to the positive amplification signal AOUT by differentially amplifying the positive amplification signal AOUT and the negative amplification signal AOUTB. A differential amplification circuit of any type may be implemented as the buffer 230.

Referring to FIG. 2, the noise boosting circuit 220 may further include an equalization filter ("EQ Filter") 221 and a summer 222. The equalization filter 221 may generate the positive equalization signal EQ and the negative equalization signal EQB by receiving the first input signal IN1 and the second input signal IN2.

The equalization filter 221 may generate the positive equalization signal EQ and the negative equalization signal EQB by differentially amplifying the first input signal IN1 and the second input signal IN2. The equalization filter 221 may have a characteristic of reducing a DC gain and increasing an AC gain of a signal. For example, the equalization filter 221 may be a continuous time linear equalizer (CTLE). The continuous time linear equalizer may generate, from an input signal, a signal having the reduced DC gain and the increased AC gain. The DC gain may be a gain of the equalization filter 221 when the first input signal IN1 keeps the voltage level of a steady state. The AC gain may be a gain of the equalization filter 221 when the voltage level of the first input signal IN1 is in a transition state.

The summer 222 may receive the positive equalization signal EQ and the negative equalization signal EQB. The summer 222 may change the voltage level of the positive amplification signal AOUT and may reduce the amplitude of the positive amplification signal AOUT based on the positive equalization signal EQ. The summer 222 may change the voltage level of the negative amplification signal AOUTB and may reduce the amplitude of the negative amplification signal AOUTB based on the negative equalization signal EQB. The summer 222 may generate the first noise boosting signal NS based on the positive equalization signal EQ and may generate the second noise boosting signal NSB based on the negative equalization signal EQB. The summer 222 may be coupled to the first amplification node A1 and the second amplification node A2. The first noise boosting signal NS may be output through the first amplification node A1 and the second noise boosting signal NSB may be output through the second amplification node A2. For example, the summer 222 may lower the voltage level of the first amplification node A1 based on the positive equalization signal EQ and may lower the voltage level of the second amplification node A2 based on the negative equalization signal EQB.

Figure 3:
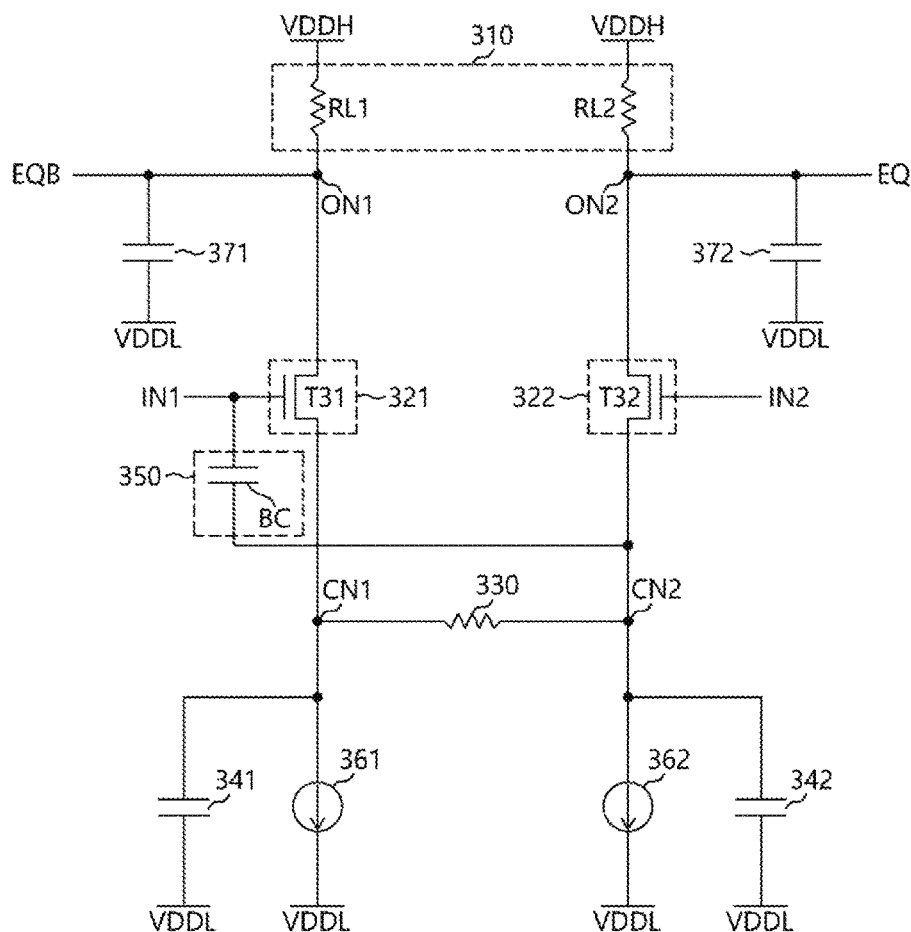
FIG. 3 is a diagram illustrating a configuration of an equalization filter in accordance with an embodiment of the present disclosure.

FIG. 3 is a diagram illustrating a configuration of an equalization filter 300 in accordance with an embodiment of the present disclosure. The equalization filter 300 may be implemented as the equalization filter 221 of FIG. 2. Referring to FIG. 3, the equalization filter 300 may include a load unit 310, a first input unit 321, a second input unit 322, a source resistor 330, a first capacitor 341, a second capacitor 342 and a gain booster 350. The load unit 310 may be coupled among a high voltage rail, a first output node ON1 and a second output node ON2. A high voltage VDDH may be provided to the equalization filter 300 through the high voltage rail. The high voltage VDDH may be a power voltage of the reception circuit 200 and a semiconductor apparatus including the reception circuit 200. The load unit 310 may provide the high voltage VDDH to the first output node ON1 and the second output node ON2.

The first input unit 321 may be coupled between the first output node ON1 and a first common node CN1. The first common node CN1 may be coupled to a low voltage rail. A low voltage VDDL may be provided to the equalization filter 300 through the low voltage rail. The low voltage VDDL may have a lower level than the high voltage VDDH. For example, the low voltage VDDL may have a level corresponding to a ground voltage. The first input unit 321 may receive the first input signal IN1 illustrated in FIG. 2. The first input unit 321 may change the voltage level of the first output node ON1 based on the first input signal IN1. The negative equalization signal EQB illustrated in FIG. 2 may be output through the first output node ON1.

The second input unit 322 may be coupled between the second output node ON2 and a second common node CN2. The second common node CN2 may be coupled to the low voltage rail. The second input unit 322 may receive the second input signal IN2 illustrated in FIG. 2. The second input unit 322 may change the voltage level of the second output node ON2 based on the second input signal IN2. The positive equalization signal EQ illustrated in FIG. 2 may be output through the second output node ON2.

The source resistor 330 may be coupled between the first common node CN1 and the second common node CN2. The source resistor 330 may form a current path between the first common node CN1 and the second common node CN2. The source resistor 330 may serve as a virtual ground configured to allow a current to flow from the first common node CN1 to the second common node CN2 or from the second common node CN2 to the first common node CN1. The source resistor 330 may adjust a gain of the equalization filter 300. For example, the source resistor 330 may decrease the DC gain of the equalization filter 300 while increasing the AC gain of the equalization filter 300.

The first capacitor 341 may be coupled between the first common node CN1 and the low voltage rail. The second capacitor 342 may be coupled between the second common node CN2 and the low voltage rail. The second capacitor 342 may have the same capacitance as the first capacitor 341. The first capacitor 341 and the second capacitor 342 may be provided to adjust the AC gain of the equalization filter 300. In an embodiment, the second capacitor 342 may have different capacitance from the first capacitor 341. For example, the first capacitor 341 may have greater capacitance than the second capacitor 342. In an embodiment, the first capacitor 341 and the second capacitor 342 may be implemented as programmable capacitors having variable capacitance to adjust the magnitude and/or bandwidth of the AC gain within the equalization filter 300. The bandwidth of the AC gain may a frequency range, with which a amplification circuit can obtain a gain of a predetermined size or greater. The word "predetermined" as used herein with respect to a parameter, such as a predetermined size, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The equalization filter 300 may further include a first current source 361 and a second current source 362. The first current source 361 may be coupled, in parallel with the first capacitor 341, between the first common node CN1 and the low voltage rail. The second current source 362 may be coupled, in parallel with the second capacitor 342, between the second common node CN2 and the low voltage rail. The first current source 361 and the second current source 362 may respectively form current paths from the first common node CN1 and the second common node CN2 to the low voltage rail when the first input signal IN1 has a voltage level in the steady state.

The gain booster 350 may receive the first input signal IN1. The gain booster 350 may change the voltage level of the second common node CN2 based on the first input signal IN1. When the first input signal IN1 has a voltage level in the transition state, the gain booster 350 may increase the AC gain of the equalization filter 300 by changing the voltage level of the second common node CN2. For example, when the voltage level of the first input signal IN1 changes from a low level to a high level, the gain booster 350 may increase the voltage level of the second common node CN2. When the voltage level of the first input signal IN1 changes from a high level to a low level, the gain booster 350 may decrease the voltage level of the second common node CN2. As used herein, a signal, such the first input signal IN1 or a second input signal IN2, etc., having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

Referring to FIG. 3, the load unit 310 may include a first load resistor RL1 and a second load resistor RL2. The first load resistor RL1 may be coupled between the high voltage rail and the first output node ON1. The second load resistor RL2 may be coupled between the high voltage rail and the second output node ON2. The first load resistor RL1 may be coupled to the high voltage rail and receive the high voltage VDDH at one end, and may be coupled to the first output node ON1 at the other end. The second load resistor RL2 may be coupled to the high voltage rail and receive the high voltage VDDH at one end, and may be coupled to the second output node ON2 at the other end. The first load resistor RL1 and the second load resistor RL2 may have the same resistance value to each other. The first load resistor RL1 and the second load resistor RL2 may be implemented as programmable resistance elements having variable resistance to adjust the bandwidth of the AC gain within the equalization filter 300.

The first input unit 321 may include a first transistor T31. For example, the first transistor T31 may be the N channel MOS transistor. The first transistor T31 may receive the first input signal IN1 at its gate, may be coupled to the first output node ON1 at its drain and may be coupled to the first common node CN1 at its source. The second input unit 322 may include a second transistor T32. For example, the second transistor T32 may be the N channel MOS transistor. The second transistor T32 may receive the second input signal IN2 at its gate, may be coupled to the second output node ON2 at its drain and may be coupled to the second common node CN2 at its source.

The gain booster 350 may include a boosting capacitor BC. The boosting capacitor BC may be coupled to the node into which the first input signal IN1 is input (i.e., the gate of the first transistor T31) and the second common node CN2. The boosting capacitor BC may receive the first input signal IN1 at one end and may be coupled to the second common node CN2 at the other end. The boosting capacitor BC may be implemented as a programmable capacitor having variable capacitance.

The equalization filter 300 may further include a first load capacitor 371 and a second load capacitor 372. The first load capacitor 371 may be coupled to the first output node ON1. The second load capacitor 372 may be coupled to the second output node ON2. The first load capacitor 371 and the second load capacitor 372 may have the same capacitance with each other. In an embodiment, the first load capacitor 371 and the second load capacitor 372 may be implemented as programmable capacitors having variable capacitance to adjust the bandwidth of the AC gain within the equalization filter 300.

When the first input signal IN1 keeps the voltage level in the steady state, a current may flow through the source resistor 330 and steady currents may flow from the first common node CN1 and the second common node CN2 to the low voltage rail respectively through the first current source 361 and the second current source 362. Therefore, the positive equalization signal EQ and the negative equalization signal EQB may keep constant voltage levels. When the voltage level of the first input signal IN1 changes from a low level to a high level, the first transistor T31 may be turned on. Therefore, the voltage level of the first output node ON1 may be lowered, the amount of the current flowing to the first common node CN1 and the first capacitor 341 may be increased and the voltage level of the first common node CN1 may be elevated. When the second input signal IN2 is a reference voltage, the amount of the current flowing to the second common node CN2 and the second capacitor 342 might not change and the voltage level of the second common node CN2 may be kept to a constant. Therefore, the voltage level of the first output node ON1 may be sufficiently lowered to the low voltage VDDL while the voltage level of the second output node ON2 might not be sufficiently elevated to the high voltage VDDH. Also, a peak may be formed within the negative equalization signal EQB while a peak might not be formed within the positive equalization signal EQ. In accordance with an embodiment of the present disclosure, the gain booster 350 may change the voltage level of the second common node CN2 based on the first input signal IN1. The boosting capacitor BC may elevate the voltage level of the second common node CN2 when the voltage level of the first input signal IN1 changes from a low level to a high level. When the voltage level of the second common node CN2 is elevated, the voltage difference between the gate and the source of the second transistor T32 may be reduced and an amount of a current flowing through the second transistor T32 may be reduced. Therefore, the voltage level of the second output node ON2 may be sufficiently elevated to the high voltage VDDH and a peak may be formed within the positive equalization signal EQ generated from the second output node ON2. With the gain booster 350, the equalization filter 300 may balance the AC gains of the negative equalization signal EQB and the positive equalization signal EQ by increasing the AC gain of the output signal OUT.

When the voltage level of the first input signal IN1 changes from a high level to a low level, the first transistor T31 may be turned off. Therefore, the voltage level of the first output node ON1 may be elevated, the amount of the current flowing to the first common node CN1 and the first capacitor 341 may be reduced and the voltage level of the first common node CN1 may be lowered. When the second input signal IN2 is a reference voltage, the amount of the current flowing to the second common node CN2 and the second capacitor 342 might not change and the voltage level of the second common node CN2 may be kept to a constant. Therefore, the voltage level of the first output node ON1 may be sufficiently elevated to the high voltage VDDH while the voltage level of the second output node ON2 might not be sufficiently lowered to the low voltage VDDL. Also, a peak may be formed within the negative equalization signal EQB while a peak might not be formed within the positive equalization signal EQ. In accordance with an embodiment of the present disclosure, the gain booster 350 may change the voltage level of the second common node CN2 based on the first input signal IN1. The boosting capacitor BC may lower the voltage level of the second common node CN2 when the voltage level of the first input signal IN1 changes from a high level to a low level. When the voltage level of the second common node CN2 is lowered, the voltage difference between the gate and the source of the second transistor T32 may be increased and an amount of a current flowing through the second transistor T32 may be increased. Therefore, the voltage level of the second output node ON2 may be sufficiently lowered to the low voltage VDDL and a peak may be formed within the positive equalization signal EQ generated from the second output node ON2. With the gain booster 350, the equalization filter 300 may balance the AC gains of the negative equalization signal EQB and the positive equalization signal EQ by increasing the AC gain of the positive equalization signal EQ.

Figure 4:
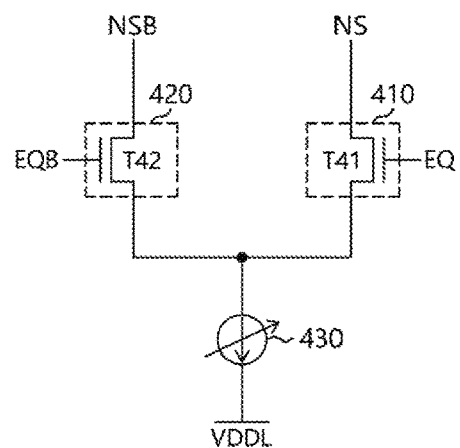
FIG. 4 is a diagram illustrating a configuration of a summer in accordance with an embodiment of the present disclosure.

FIG. 4 is a diagram illustrating a configuration of a summer 400 in accordance with an embodiment of the present disclosure. The summer 400 may be implemented as the summer 222 illustrated in FIG. 2. The summer 400 may include a first voltage adjustment unit 410 and a second voltage adjustment unit 420. The first voltage adjustment unit 410 may receive the positive equalization signal EQ. The first voltage adjustment unit 410 may generate the first noise boosting signal NS based on the positive equalization signal EQ. The first voltage adjustment unit 410 may change the voltage level of the first noise boosting signal NS based on the positive equalization signal EQ. The first noise boosting signal NS may be provided to the first amplification node A1 illustrated in FIG. 2. The second voltage adjustment unit 420 may receive the negative equalization signal EQB. The second voltage adjustment unit 420 may generate the second noise boosting signal NSB based on the negative equalization signal EQB. The second voltage adjustment unit 420 may change the voltage level of the second noise boosting signal NSB based on the negative equalization signal EQB. The second noise boosting signal NSB may be provided to the second amplification node A2 illustrated in FIG. 2.

The first voltage adjustment unit 410 may include a first transistor T41. For example, the first transistor T41 may be the N channel MOS transistor. The first transistor T41 may receive the positive equalization signal EQ at its gate and may be coupled to the low voltage rail, to which the low voltage VDDL is provided through a variable current source 430, at its source. The first transistor T41 may output the first noise boosting signal NS at its drain. The second voltage adjustment unit 420 may include a second transistor T42. For example, the second transistor T42 may be the N channel MOS transistor. The second transistor T42 may receive the negative equalization signal EQB at its gate and may be coupled to the low voltage rail, to which the low voltage VDDL is provided through the variable current source 430, at its source. The second transistor T42 may output the second noise boosting signal NSB at its drain. The variable current source 430 may be provided to adjust change amounts of voltage levels of the first noise boosting signal NS and the second noise boosting signal NSB.

Figure 5:
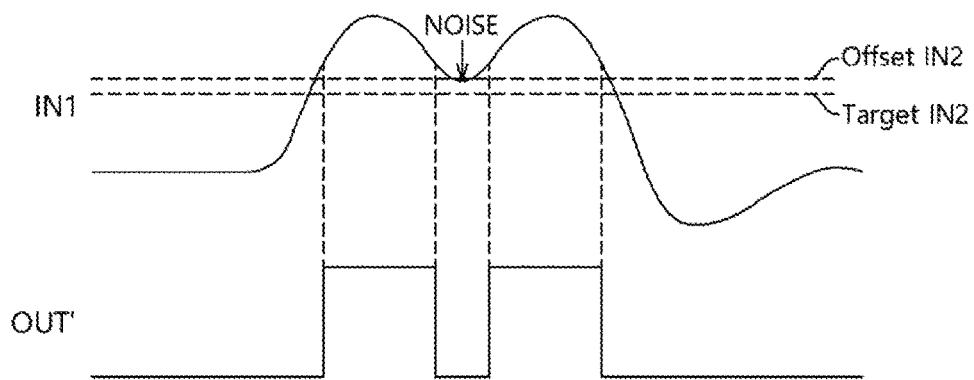
FIGS. 5 and 6 are waveforms illustrating an operation of a reception circuit in accordance with an embodiment of the present disclosure.
Figure 6:
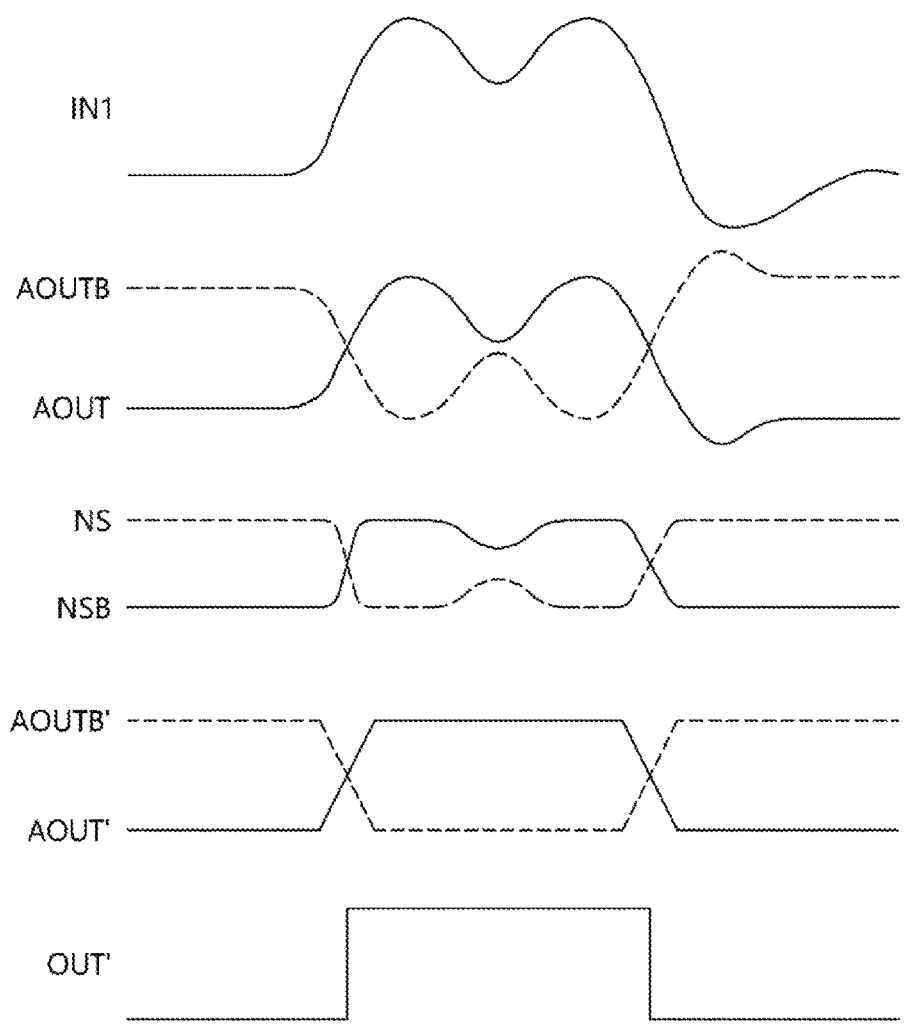

FIGS. 5 and 6 are waveforms illustrating an operation of the reception circuit 200 in accordance with an embodiment of the present disclosure. FIG. 5 shows an operation of a reception circuit without the noise boosting circuit 220. FIG. 5 provides an example of the first input signal IN1, the voltage level of which is changed from a low level to a high level and then back to the low level. Because the first input signal IN1 may be transferred through the first bus 131 or the second bus 132 illustrated in FIG. 1, there may occur a noise at a main cursor of the first input signal IN1 due to the channel reflection or the cross-talk caused by neighbouring channels. Therefore, as illustrated in FIG. 5, there may occur a noise that the voltage level of the first input signal IN1 becomes lowered at a high-level state of the first input signal IN1 or a noise that the voltage level of the first input signal IN1 becomes lowered below a low level of the first input signal IN1. Also, when there occurs an offset of the second input signal IN2, the second input signal IN2 may have a different voltage level from a target level target IN2. FIG. 5 provides an example of the voltage level Offset IN2 of the second input signal IN2, which has an offset, the voltage level Offset IN2 being higher than the target level target IN2. When the receiver 210 differentially amplifies the noise of the first input signal IN1 with the second input signal IN2, there may occur a case that the voltage levels of the positive amplification signal AOUT and the negative amplification signal AOUTB become to have very little difference or become reversed. Therefore, the buffer 230 may output the output signal OUT' having its voltage level changing to a low level based on the noise even when the buffer 230 is supposed to generate the output signal OUT' keeping its voltage level to a high level.

Referring to FIG. 6, the noise boosting circuit 220 may generate, based on the first input signal IN1, the first noise boosting signal NS, the voltage level of which changes complementarily to the voltage level change of the first input signal IN1. The second noise boosting signal NSB may have the voltage level complementary to the voltage level of the first noise boosting signal NS. The equalization filter 221 may have the increased AC gain and the decreased DC gain. Therefore, the transition gradients of the first noise boosting signal NS and the second noise boosting signal NSB may be greater than the transition gradients of the positive amplification signal AOUT and the negative amplification signal AOUTB. Also, the amplitudes of the first noise boosting signal NS and the second noise boosting signal NSB may be less than the amplitudes of the positive amplification signal AOUT and the negative amplification signal AOUTB. When the first noise boosting signal NS is mixed with the positive amplification signal AOUT and the second noise boosting signal NSB is mixed with the negative amplification signal AOUTB, the compensated positive amplification signal AOUT' may be in a steady state of a high voltage level without the affection of the noise and the compensated negative amplification signal AOUTB' may be in a steady state of a low voltage level. The buffer 230 may generate the output signal OUT changing to a high voltage level to be kept in a steady state of a high voltage level by differentially amplifying the compensated positive amplification signal AOUT' and the compensated negative amplification signal AOUTB'.

Figure 7A:
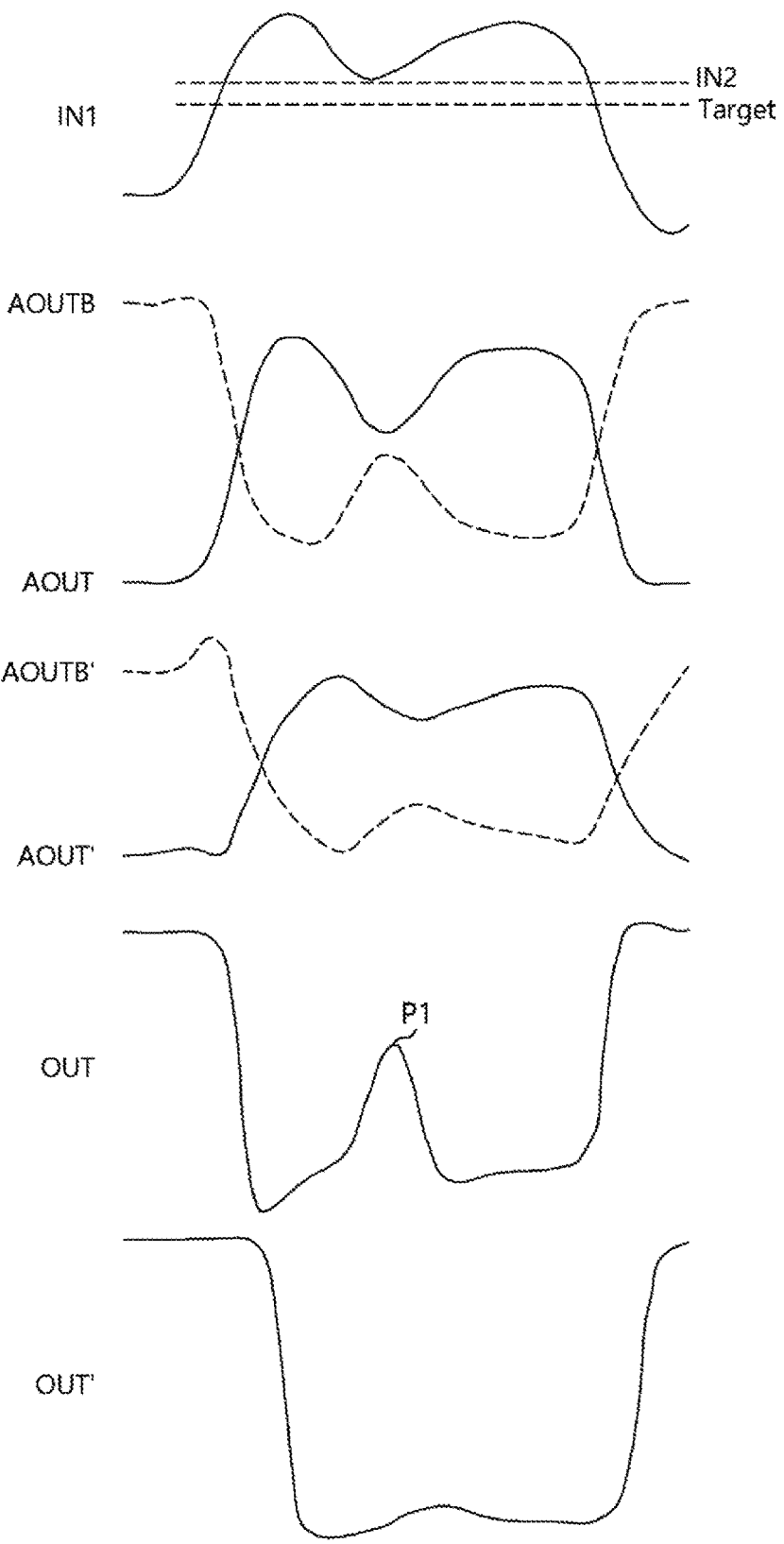
FIGS. 7A, 7B and 7C are waveforms illustrating an operation of a reception circuit based on a voltage level of a second input signal when there occurs a noise within a first input signal.
Figure 7B:
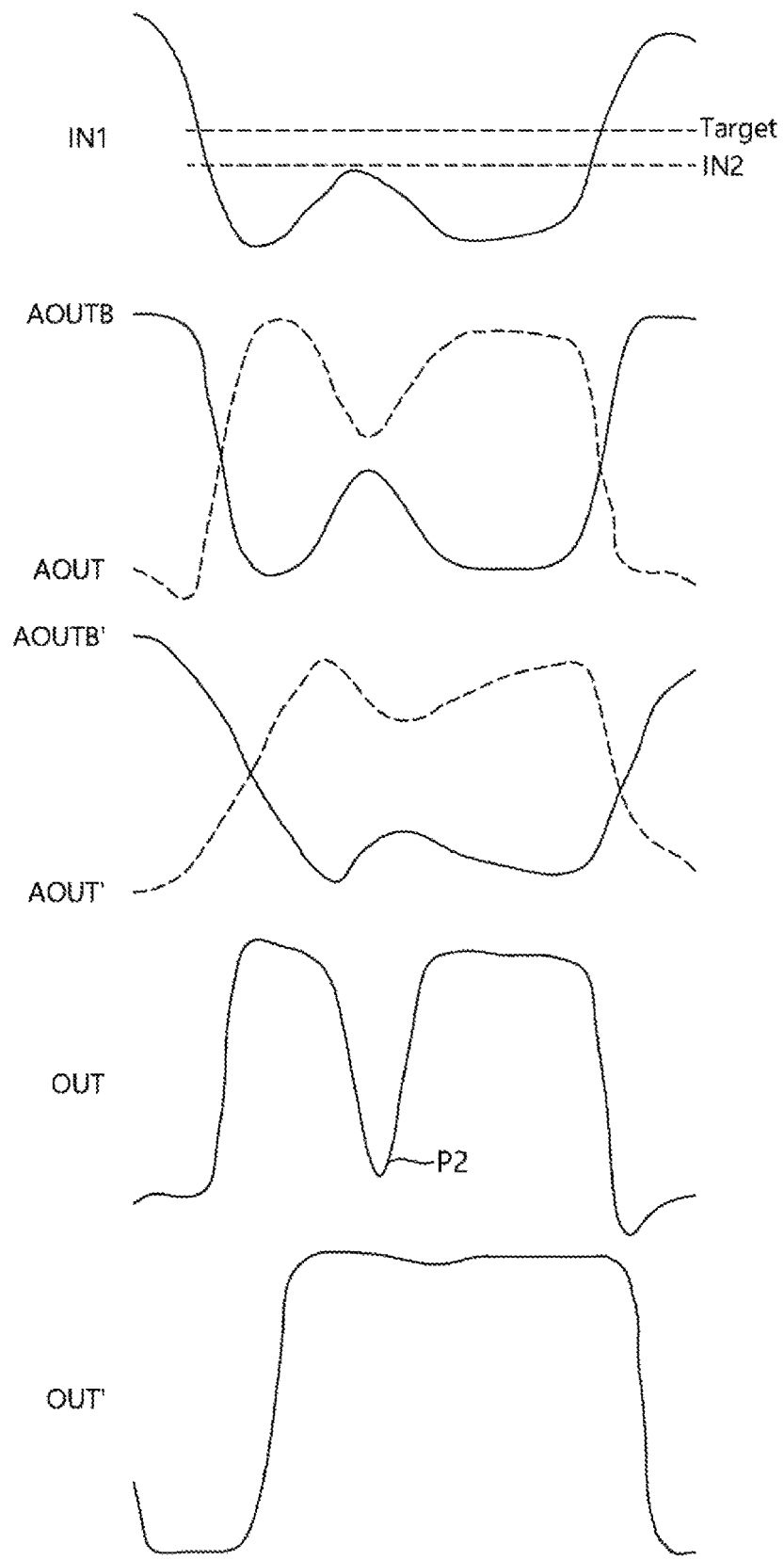
Figure 7C:
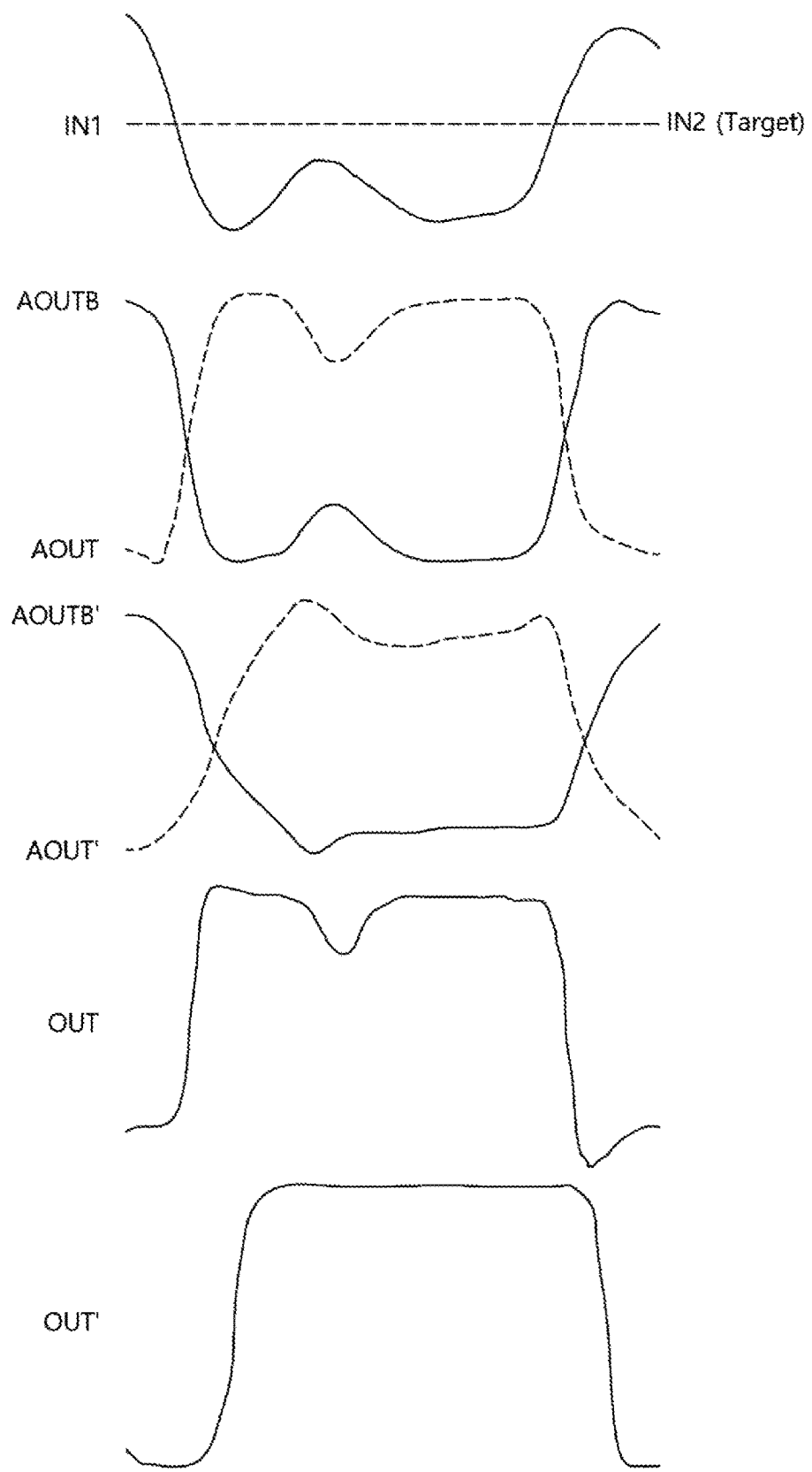

FIGS. 7A, 7B and 7C are waveforms illustrating an operation of the reception circuit 200 based on the voltage level of the second input signal IN2 when there occurs a noise within the first input signal IN1. FIG. 7A shows a wave form of the output signal OUT when there occurs a noise within the first input signal IN1 having the voltage level changing to a high level and the second input signal IN2 has a higher voltage level than a target level Target. When there occurs a noise within the first input signal IN1, the voltage level difference between the positive amplification signal AOUT and the negative amplification signal AOUTB may become smaller. When the noise boosting circuit 220 is not provided, the buffer 230 may generate the output signal OUT including a pulse P1 that keeps its voltage level at a low level and then changes its voltage level to a high level and might not normally generate the output signal OUT corresponding to the first input signal IN1. The noise boosting circuit 220 may increase the voltage difference between the positive amplification signal AOUT and the negative amplification signal AOUTB by generating the first noise boosting signal NS and the second noise boosting signal NSB, the voltage levels of which change complementarily to the voltage level changes of the positive amplification signal AOUT and the negative amplification signal AOUTB. The buffer 230 may generate the output signal OUT' kept in a steady state of a low voltage level by amplifying the compensated positive amplification signal AOUT' and the compensated negative amplification signal AOUTB'.

FIG. 7B shows a wave form of the output signal OUT when there occurs a noise within the first input signal IN1 having the voltage level changing to a low level and the second input signal IN2 has a lower voltage level than a target level Target. When there occurs a noise within the first input signal IN1, the voltage level difference between the positive amplification signal AOUT and the negative amplification signal AOUTB may become smaller. When the noise boosting circuit 220 is not provided, the buffer 230 may generate the output signal OUT including a pulse P2 that keeps its voltage level at a high level and then changes its voltage level to a low level and might not normally generate the output signal OUT corresponding to the first input signal IN1. The noise boosting circuit 220 may increase the voltage difference between the positive amplification signal AOUT and the negative amplification signal AOUTB by generating the first noise boosting signal NS and the second noise boosting signal NSB, the voltage levels of which change complementarily to the voltage level changes of the positive amplification signal AOUT and the negative amplification signal AOUTB. The buffer 230 may generate the output signal OUT' kept in a stead state of a high voltage level by amplifying the compensated positive amplification signal AOUT' and the compensated negative amplification signal AOUTB'.

FIG. 7C shows a wave form of the output signal OUT when there occurs a noise within the first input signal IN1 having the voltage level changing to a low level and the second input signal IN2 has a target level Target. When the second input signal IN2 has a target level Target, the voltage level difference between the positive amplification signal AOUT and the negative amplification signal AOUTB may be substantial when compared with the cases of FIGS. 7A and 7B. Therefore, the buffer 230 may generate the output signal OUT substantially in a steady state of a high voltage level with little fluctuation to a low level based on the noise even when the noise boosting circuit 220 is not provided. When the noise boosting circuit 220 changes the voltage levels of the positive amplification signal AOUT and the negative amplification signal AOUTB, the fluctuation caused by the noise may be mitigated or eliminated. The buffer 230 may generate the output signal OUT' kept in a stead state of a high voltage level without the fluctuation by amplifying the compensated positive amplification signal AOUT' and the compensated negative amplification signal AOUTB'.

Figure 8:
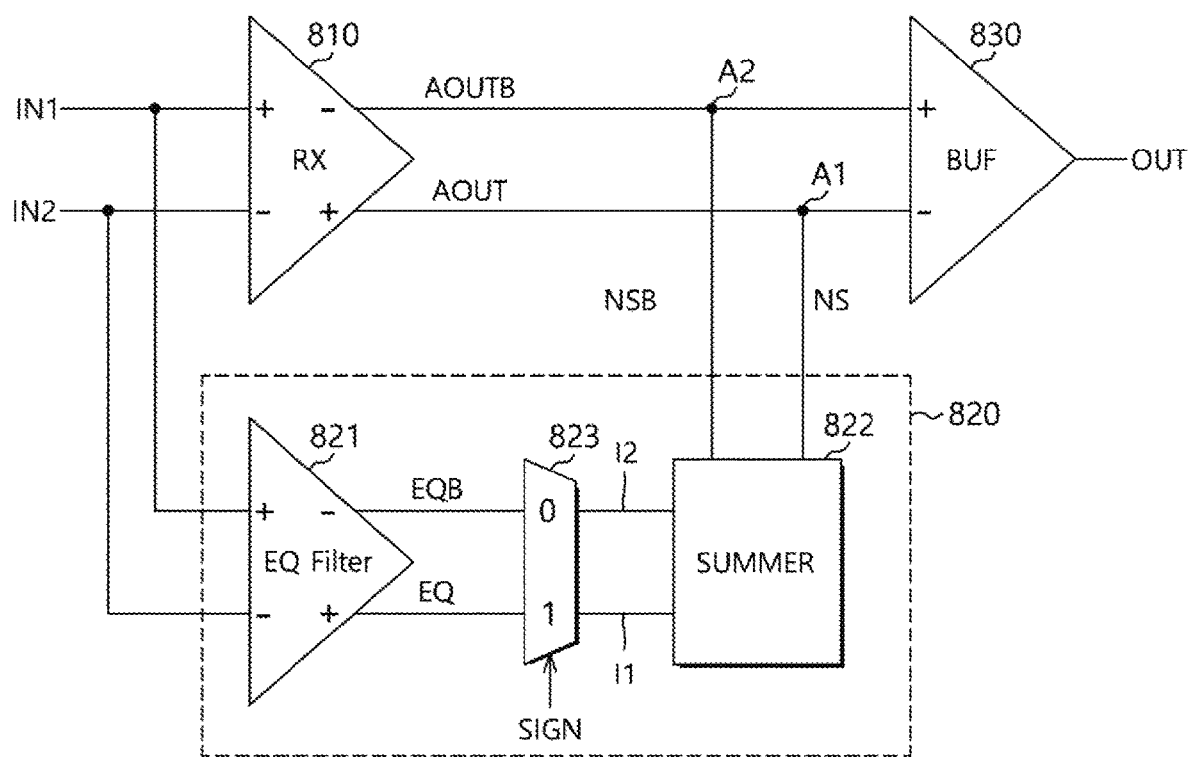
FIG. 8 is a diagram illustrating a configuration of a reception circuit in accordance with an embodiment of the present disclosure.

FIG. 8 is a diagram illustrating a configuration of a reception circuit 800 in accordance with an embodiment of the present disclosure. The reception circuit 800 may be implemented as at least one among the reception circuit 114, the first reception circuit 122 and the second reception circuit 124 illustrated in FIG. 1. Referring to FIG. 8, the reception circuit 800 may include a receiver 810, a noise boosting circuit 820 and a buffer 830. Except the noise boosting circuit 820, the reception circuit 800 may have the same elements as the reception circuit 200 illustrated in FIG. 2. The same elements of the reception circuit 800 are illustrated with reference numbers similar to the reception circuit 200 and duplicated description on the same elements of the reception circuit 800 will not be made here.

Based on the characteristics of the channel transferring the first input signal IN1, the noise boosting circuit 820 may generate the first noise boosting signal NS based on one between the positive equalization signal EQ and the negative equalization signal EQB and may generate the second noise boosting signal NSB based on the other one between the positive equalization signal EQ and the negative equalization signal EQB. The characteristics of the channel through which the first input signal IN1 is transmitted may include a first characteristic and a second characteristic. For example, the first characteristic and the second characteristic may be determined based on the characteristics of the pre-cursor and/or the main cursor of the first input signal IN1. When the channel characteristic of the channel is the first characteristic, the noise boosting circuit 820 may generate the first noise boosting signal NS based on the positive equalization signal EQ and may generate the second noise boosting signal NSB based on the negative equalization signal EQB. When the channel characteristic of the channel is the second characteristic, the noise boosting circuit 820 may generate the first noise boosting signal NS based on the negative equalization signal EQB and may generate the second noise boosting signal NSB based on the positive equalization signal EQ. The first characteristic may be the characteristic of the channel when there occurs a noise that the voltage level of the first input signal IN1 is lowered while the first input signal IN1 in the steady state of a high voltage level or a noise that the voltage level of the first input signal IN1 is elevated while the first input signal IN1 in the steady state of a low voltage level, as illustrated in FIGS. 5 and 6. The second characteristic will be described later with reference to FIGS. 9 and 10.

The noise boosting circuit 820 may include an equalization filter 821, an input selector 823 and a summer 822. The equalization filter 821 and the summer 822 may be the same as the equalization filter 221 and the summer 222 illustrated in FIG. 2. The equalization filter 821 may generate the positive equalization signal EQ and the negative equalization signal EQB based on the first input signal IN1 and the second input signal IN2. The input selector 823 may receive the positive equalization signal EQ and the negative equalization signal EQB from the equalization filter 821 and may further receive a channel characteristic signal SIGN. The channel characteristic signal SIGN may have different logic levels based on the characteristic of the channel transferring the first input signal IN1. For example, the channel characteristic signal SIGN may have a logic high level when the characteristic of the channel is the first characteristic and may have a logic low level when the characteristic of the channel is the second characteristic. The input selector 823 may output the positive equalization signal EQ to a first input node I1 and may output the negative equalization signal EQB to a second input node I2 when the channel characteristic signal SIGN has a logic high level. The input selector 823 may output the positive equalization signal EQ to the second input node I2 and may output the negative equalization signal EQB to the first input node I1 when the channel characteristic signal SIGN has a logic low level.

The summer 822 may be coupled to the first input node and the second input node I2 and may receive the positive equalization signal EQ and the negative equalization signal EQB provided from the input selector 823. The summer 822 may change the voltage level and/or the amplitude of the positive amplification signal AOUT based on the signal provided through the first input node IL The summer 822 may change the voltage level and/or the amplitude of the negative amplification signal AOUTB based on the signal provided through the second input node I2. When the characteristic of the channel is the first characteristic, the summer 822 may change the voltage level and/or the amplitude of the positive amplification signal AOUT based on the positive equalization signal EQ provided through the first input node I1 and may change the voltage level and/or the amplitude of the negative amplification signal AOUTB based on the negative equalization signal EQB provided through the second input node I2. When the characteristic of the channel is the second characteristic, the summer 822 may change the voltage level and/or the amplitude of the positive amplification signal AOUT based on the negative equalization signal EQB provided through the first input node I1 and may change the voltage level and/or the amplitude of the negative amplification signal AOUTB based on the positive equalization signal EQ provided through the second input node I2.

Figure 9:
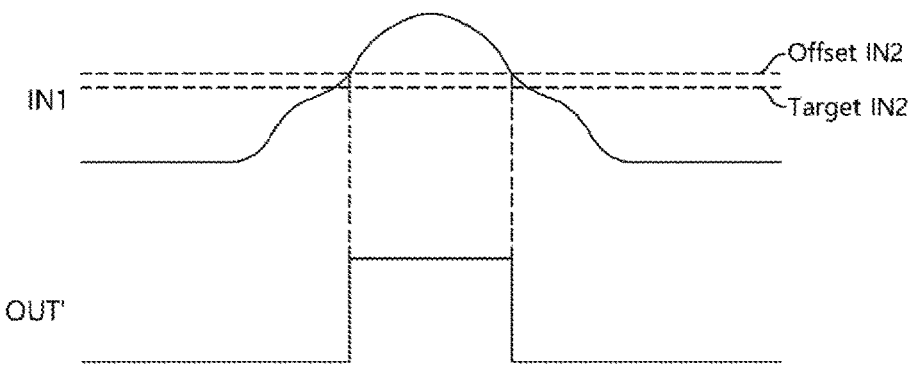
FIGS. 9 and 10 are waveforms illustrating an operation of a reception circuit in accordance with an embodiment of the present disclosure.
Figure 10:
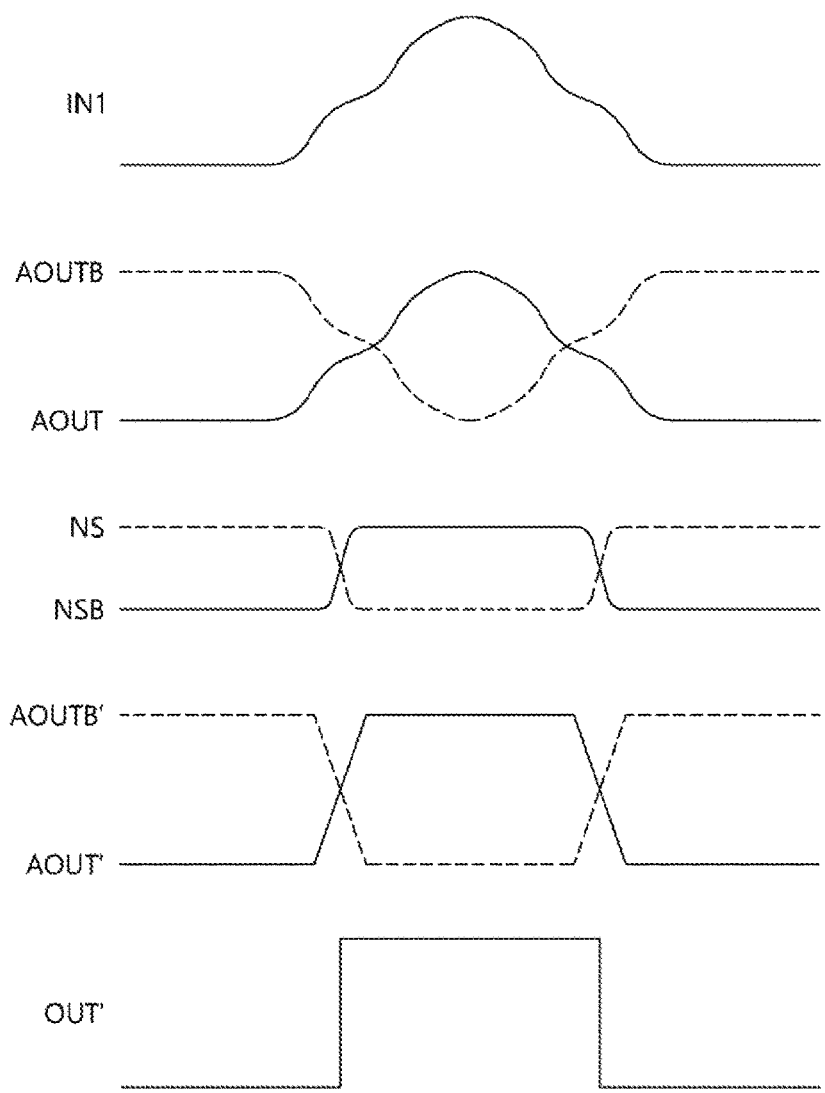

FIGS. 9 and 10 are waveforms illustrating an operation of the reception circuit 800 in accordance with an embodiment of the present disclosure. FIG. 9 shows an operation of the reception circuit 800 when the characteristic of the channel is the second characteristic and the noise boosting circuit 820 is not provided. The voltage level of the first input signal IN1 may be changed to a high level and then to a low level. When the characteristic of the channel is the second characteristic, it may take more time for the voltage level of the first input signal IN1 to be changed to a high level and it may take less time for the voltage level of the first input signal IN1 to be changed to a low level, due to the noise within the first input signal IN1. FIG. 9 provides an example of a case where there occurs an offset of the second input signal IN2 and the voltage level Offset IN2 of the second input signal IN2 having the offset is greater than a target level target IN2. When the receiver 810 differentially amplifies the first input signal IN1, in which there occurs a noise, and the second input signal IN2, the voltage level Offset IN2 of which is greater than the target level target IN2, there may be a very short duration where there occurs a voltage difference between the positive amplification signal AOUT and the negative amplification signal AOUTB and the buffer 230 may generate the output signal OUT having a narrow pulse width.

Referring to FIG. 10, the noise boosting circuit 820 may generate, based on the first input signal IN1, the first noise boosting signal NS, the voltage level of which changes complementarily to the voltage level change of the first input signal IN1. The second noise boosting signal NSB may have the voltage level complementary to the voltage level of the first noise boosting signal NS. The equalization filter 821 may have the increased AC gain and the decreased DC gain. Therefore, the transition gradients of the first noise boosting signal NS and the second noise boosting signal NSB may be greater than the transition gradients of the positive amplification signal AOUT and the negative amplification signal AOUTB. Also, the amplitudes of the first noise boosting signal NS and the second noise boosting signal NSB may be less than the amplitudes of the positive amplification signal AOUT and the negative amplification signal AOUTB. When the first noise boosting signal NS is mixed with the positive amplification signal AOUT and the second noise boosting signal NSB is mixed with the negative amplification signal AOUTB, the voltage level of the compensated positive amplification signal AOUT' may be changed faster to a high voltage level without the affection of the noise and the voltage level of the compensated negative amplification signal AOUTB' may be changed faster to a low voltage level. The buffer 230 may generate the output signal OUT having a normal pulse width by differentially amplifying the compensated positive amplification signal AOUT' and the compensated negative amplification signal AOUTB'.

While certain embodiments have been described above, it will be understood to those skilled in the art that the embodiments described are by way of example only. Accordingly, the signal receiving circuit, semiconductor apparatus and semiconductor system using the same should not be limited based on the described embodiments. Rather, the signal receiving circuit, semiconductor apparatus and semiconductor system using the same described herein should only be limited in light of the claims that follow when taken in conjunction with the above description and accompanying drawings.

What is claimed is:

1. A reception circuit comprising:
   a receiver configured to amplify a first input signal and a reference voltage to generate a positive amplification signal and a negative amplification signal, the reference voltage having a voltage level corresponding to substantially a middle of a swing of the first input signal;
   a noise boosting circuit configured to generate a positive equalization signal and a negative equalization signal based on the first input signal and the second input signal, to adjust voltage levels of the positive amplification signal and the negative amplification signal based on the positive equalization signal and the negative equalization signal; and
   a buffer configured to amplify the positive amplification signal and the negative amplification signal to generate an output signal.

2. The reception circuit of claim 1, wherein the noise boosting circuit comprises:
   an equalization filter configured to amplify the first input signal and the reference voltage to generate the positive equalization signal and the negative equalization signal; and
   a summer configured to change the voltage level of the positive amplification signal based on the positive equalization signal, and to change the voltage level of the negative amplification signal based on the negative equalization signal.

3. The reception circuit of claim 2, wherein the summer is configured:
- to generate a first noise boosting signal based on the positive equalization signal;
- to mix the first noise boosting signal with the positive amplification signal;
- to generate a second noise boosting signal based on the negative equalization signal; and
- to mix the second noise boosting signal with the negative amplification signal.

4. The reception circuit of claim 1, wherein the noise boosting circuit generates a first noise boosting signal having a voltage level of which changes complementarily to a voltage level change of the first input signal.

5. A reception circuit comprising:
- a receiver configured to output a positive amplification signal to a first amplification node and output a negative amplification signal to a second amplification node, based on a first input signal and a reference voltage which has a voltage level corresponding to substantially a middle of a swing range of the first input signal;
- a noise boosting circuit configured to generate a first noise boosting signal of which a voltage level varies complementarily to the positive amplification signal, and a second noise boosting signal of which a voltage varies complementarily to the negative amplification signal, based on the first input signal and the second input signal; and to output the first noise boosting signal and the second noise boosting signal respectively to the first amplification node and the second amplification node; and
- a buffer configured to generate an output signal based on voltage levels of the first amplification node and the second amplification node.

6. The reception circuit of claim 5, wherein the first input signal is a single ended signal.

7. The reception circuit of claim 5, wherein the noise boosting circuit comprises:
- an equalization filter configured to generate a positive equalization signal and a negative equalization signal by amplifying the first input signal and the reference voltage; and
- a summer configured to generate the first noise boosting signal based on the positive equalization signal, and to generate the second noise boosting signal based on the negative equalization signal.

8. A reception circuit comprising:
- a receiver configured to amplify a first input signal and a second input signal to generate a positive amplification signal and a negative amplification signal;
- a noise boosting circuit configured to generate a positive equalization signal and a negative equalization signal based on the first input signal and the second input signal, to change the voltage level of the positive amplification signal based on the positive equalization signal and to change the voltage level of the negative amplification signal based on the negative equalization signal, when a characteristic of a channel through which the first input signal is transmitted is a first characteristic, and to change the voltage level of the negative amplification signal based on the positive equalization signal and to change the voltage level of the positive amplification signal based on the negative equalization signal, when the characteristic of the channel is a second characteristic; and
- a buffer configured to generate an output signal by amplifying the positive amplification signal and the negative amplification signal.

9. The reception circuit of claim 8, wherein the first input signal is a single ended signal.

10. The reception circuit of claim 8,
- wherein the second input signal is a reference voltage, and
- wherein the reference voltage has a voltage level corresponding to substantially a middle of a swing range of the first input signal.

11. The reception circuit of claim 8, wherein the noise boosting circuit comprises:
- an equalization filter configured to generate the positive equalization signal and the negative equalization signal by amplifying the first input signal and the second input signal;
- an input selector configured to output one between the positive equalization signal and the negative equalization signal to a first input node and to output the other one between the positive equalization signal and the negative equalization signal to a second input node, based on the characteristic of the channel; and
- a summer configured to change the voltage levels of the positive amplification signal and the negative amplification signal based on the signals received through the first input node and the second input node.

12. The reception circuit of claim 11,
- wherein the input selector is configured to output the positive equalization signal to the first input node and to output the negative equalization signal to the second input node, when the characteristic of the channel is a first characteristic, and
- wherein the summer is configured to change the voltage level of the positive amplification signal based on the positive equalization signal, and to change the voltage level of the negative amplification signal based on the negative equalization signal.

13. The reception circuit of claim 12,
- wherein the input selector is configured to output the negative equalization signal to the first input node and to output the positive equalization signal to the second input node, when the characteristic of the channel is a second characteristic, and
- wherein the summer is configured to change the voltage level of the positive amplification signal based on the negative equalization signal, and to change the voltage level of the negative amplification signal based on the positive equalization signal.

14. The reception circuit of claim 11,
- wherein the summer is configured to generate a first noise boosting signal based on the signal received through the first input node, and to generate a second noise boosting signal based on the signal received through the second input node, and
- wherein the first noise boosting signal is mixed with the positive amplification signal, and the second noise boosting signal is mixed with the negative amplification signal.

* * * * *